(12) United States Patent
Dou et al.

(10) Patent No.: US 12,550,572 B2
(45) Date of Patent: Feb. 10, 2026

(54) PIXEL ARRANGEMENT STRUCTURE AND DISPLAY PANEL

(71) Applicant: YUNGU (GU'AN) TECHNOLOGY CO., LTD., Langfang (CN)

(72) Inventors: Xiaoyu Dou, Langfang (CN); Yuetao Chen, Langfang (CN); Weijie Dai, Langfang (CN); Jingjing Zhao, Langfang (CN); Mingxing Liu, Langfang (CN)

(73) Assignee: Yungu (Gu'an) Technology Co., Ltd., Langfang (CN)

( * ) Notice: Subject to any disclaimer, the term of this patent is extended or adjusted under 35 U.S.C. 154(b) by 876 days.

(21) Appl. No.: 17/590,429

(22) Filed: Feb. 1, 2022

(65) Prior Publication Data

US 2022/0157897 A1 May 19, 2022

Related U.S. Application Data

(63) Continuation of application No. PCT/CN2020/117686, filed on Sep. 25, 2020.

(30) Foreign Application Priority Data

Dec. 6, 2019 (CN) .................. 201911244851.X

(51) Int. Cl.
  *H10K 59/35* (2023.01)
(52) U.S. Cl.
  CPC .................. *H10K 59/353* (2023.02)
(58) Field of Classification Search
  None
  See application file for complete search history.

(56) References Cited

U.S. PATENT DOCUMENTS

| | | | |
|---|---|---|---|
| 2005/0151462 A1* | 7/2005 | Miyagawa | H10K 59/353 313/500 |
| 2016/0240592 A1* | 8/2016 | Li | H10K 59/353 |

(Continued)

FOREIGN PATENT DOCUMENTS

| | | |
|---|---|---|
| CN | 101153932 A | 4/2008 |
| CN | 202153517 U | 2/2012 |

(Continued)

OTHER PUBLICATIONS

International Search Report mailed on Dec. 30, 2020, in corresponding to International Application No. PCT/CN2020/117686; 5 pages (with English Translation).

(Continued)

*Primary Examiner* — Jessica S Manno
*Assistant Examiner* — Christopher A. Schodde
(74) *Attorney, Agent, or Firm* — Maier & Maier, PLLC

(57) ABSTRACT

A pixel arrangement structure and a display panel. The pixel arrangement structure includes a plurality of sub-pixel units, and each sub-pixel unit of a plurality of sub-pixel units includes a central sub-pixel and a plurality of peripheral sub-pixels surrounding the central sub-pixel. A light emitting color of the central sub-pixel is the same as a light emitting color of the plurality of peripheral sub-pixels. Each of the plurality of sub-pixels includes a plurality of vertex angles, and each of the plurality of vertex angles is provided corresponding to a respective one of the plurality of peripheral sub-pixels.

9 Claims, 8 Drawing Sheets

(56) References Cited

U.S. PATENT DOCUMENTS

2016/0342043 A1   11/2016  Nakanishi et al.
2017/0039923 A1*  2/2017  Feng .................... H10K 59/353
2020/0185463 A1*  6/2020  Liu ....................... C23C 14/042

FOREIGN PATENT DOCUMENTS

| | | |
|---|---|---|
| CN | 101943833 B | 5/2012 |
| CN | 103337503 A | 10/2013 |
| CN | 204257652 U | 4/2015 |
| CN | 106960863 A | 7/2017 |
| CN | 108538903 A | 9/2018 |
| CN | 108681130 A | 10/2018 |
| CN | 110120406 A | 8/2019 |
| CN | 110212010 A | 9/2019 |
| CN | 110277436 A | 9/2019 |
| CN | 110993665 A | 4/2020 |
| JP | 2002-229046 A | 8/2002 |

OTHER PUBLICATIONS

The First Office Action dated Nov. 9, 2021, issued in Chinese Application No. 201911244851.X; 13 pages (with Machine Translation).

Supplemental Search Report issued Mar. 5, 2022 in Chinese Patent Application No. 201911244851X; (with English translation); 3 pages.

* cited by examiner

PIXEL ARRANGEMENT STRUCTURE AND DISPLAY PANEL

CROSS-REFERENCE TO RELATED APPLICATIONS

This application is a continuation of International Patent Application No. PCT/CN2020/117686, filed on Sep. 25, 2020, which claims priority to Chinese Patent Application No. 201911244851.X filed on Dec. 6, 2019, the disclosures of both of which are incorporated herein by reference in their entireties.

TECHNICAL FIELD

The present application relates to the field of display panels and particularly, to a pixel arrangement structure and a display panel.

BACKGROUND

With the development of the display technologies and the improvement of people's standard of living, the demand for the display effect of the display panel has been getting higher and higher.

However, in a pixel arrangement of the display panel, sub-pixels Red Green Blue (RGB) are often square in shape. An arrangement mode of pixels RGB leads to the stepped or serrated problem of display lines in a certain direction when the pixels RGB are simultaneously lighted up to display white light, and mitigating the serrated display of the display panel has become an urgent problem to be solved in the industry.

SUMMARY

The present application provides a pixel arrangement structure and a display panel to mitigate a problem of the serrated display of the display panel.

An embodiment of the present application provides a pixel arrangement structure. The pixel arrangement structure includes a plurality of sub-pixel units.

Each sub-pixel unit of the plurality of sub-pixel units includes a central sub-pixel and a plurality of peripheral sub-pixels surrounding the central sub-pixel, and a light emitting color of the central sub-pixel is the same as a light emitting color of the plurality of peripheral sub-pixels.

Each of the plurality of sub-pixels includes a plurality of vertex angles, and each of the plurality of vertex angles is provided with one of the plurality of peripheral sub-pixels.

An embodiment of the present application provides a display panel, including the pixel arrangement structure in any embodiments of the present application.

The pixel arrangement structure provided in the embodiment of the present disclosure includes the plurality of sub-pixel units, and each sub-pixel unit includes a central sub-pixel and a plurality of peripheral sub-pixels surrounding the central sub-pixel. A light emitting color of the central sub-pixel is the same as a light emitting color of the plurality of peripheral sub-pixels. Each of the plurality of sub-pixels includes a plurality of vertex angles, and each of the plurality of vertex angles is provided corresponding to a respective one of the plurality of peripheral sub-pixels. The each of the plurality of vertex angles is provided corresponding to the respective one of the plurality of peripheral sub-pixels, and when a line is displayed in a certain direction, the respective one peripheral sub-pixel disposed corresponding to each vertex angle in the each the sub-pixel unit and the central sub-pixel are separately controlled, so as to mitigate the problem of poor serrated display of the display panel.

DETAILED DESCRIPTION

Figure 1:
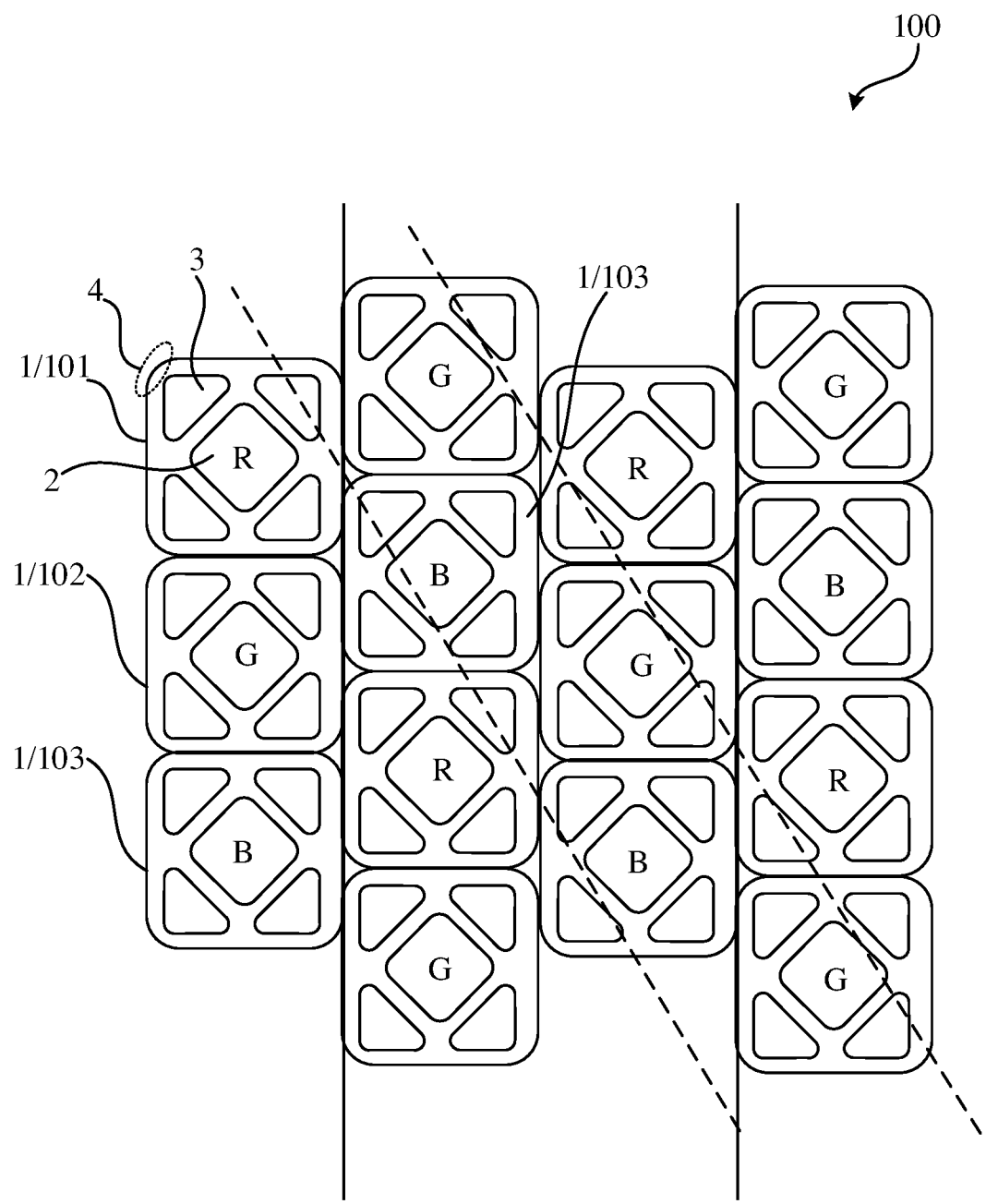
FIG. 1 is a schematic diagram of a pixel arrangement structure according to an embodiment of the present application.

The present application is described hereinafter in conjunction with drawings and embodiments. The embodiments described herein are merely intended to explain, but not to limit, the present application. For ease of description, only part, not all, of structures related to the present application are illustrated in the drawings.

As mentioned in the background there is a problem of stepped or serrated display in the pixel arrangement of the display panel. In the pixel arrangement of organic light-emitting flexible display products, such as a flexible display panel or a vehicle-mounted display screen, there will be a serrated phenomenon when diagonal lines, vertical lines or lines in one direction are displayed, which also affects the display of chamfered and round pictures, and affects the display effect.

Based on the above technical problem, the present embodiments provide the solutions described below.

FIG. 1 is a schematic diagram of a pixel arrangement structure according to an embodiment of the present application. Referring to FIG. 1, the pixel arrangement structure 100 provided in the embodiment of the present application includes a plurality of sub-pixel units 1, and each sub-pixel unit 1 includes a central sub-pixel 2 and a plurality of peripheral sub-pixels 3 surrounding the central sub-pixel 2. A light emitting color of the central sub-pixel 2 is the same as a light emitting color of the plurality of peripheral sub-pixels 3. Each of the plurality of sub-pixels 1 includes a plurality of vertex angles 4, and each of the plurality of vertex angles 4 is provided corresponding to a respective one of the plurality of peripheral sub-pixels 3.

The plurality of sub-pixel units 1 are arranged together to form a pixel arrangement structure 100. The central sub-pixel 2 and the plurality of peripheral sub-pixels 3 surrounding the central sub-pixel 2 emit light having the same color, so that the central sub-pixel 2 and the plurality of peripheral sub-pixels 3 surrounding the central sub-pixel 2 can share a mask plate opening, and the manufacturing process is simple.

The central sub-pixel 2 and the plurality of peripheral sub-pixels 3 surrounding the central sub-pixel 2 are separately controlled, and each peripheral sub-pixel 3 is arranged at a position corresponding to the respective one vertex angle 4 of the sub-pixel unit 1. When a straight line, a diagonal line or a rounded angle needs to be displayed, the plurality of peripheral sub-pixels 3 and the central sub-pixel 2 located in a desired display region are turned on, the plurality of peripheral sub-pixels 3 and the central sub-pixel 2 located outside the desired display region are turned off, and the central sub-pixel 2 and the plurality of peripheral sub-pixels 3, which emit the same color light in the desired display region, are displayed together.

In an embodiment, referring to FIG. 1, when the straight line needs to be displayed, a region between two solid lines in FIG. 1 is taken as a desired display region, the plurality of peripheral sub-pixels 3 and the central sub-pixel 2 located in the desired display region are turned on, and the plurality of peripheral sub-pixels 3 and the central sub-pixel 2 located outside the desired display region are turned off, so that a side of the desired display region is a smooth display boundary without a serrated phenomenon. When the diagonal line needs to be displayed, a region between two dotted lines in FIG. 1 is taken as a desired display region, the plurality of peripheral sub-pixels 3 and the central sub-pixel 2 located in the desired display region are turned on, and the plurality of peripheral sub-pixels 3 and the central sub-pixel 2 located outside the desired display region are turned off.

In a pixel arrangement shown in FIG. 1, a contour of the sub-pixel unit 1 is divided into the plurality of peripheral sub-pixels 3 and the central sub-pixel 2, and each vertex angle 4 of the sub-pixel unit 1 is provided corresponding to a respective one peripheral sub-pixel 3. Vertex angles of the contour of the sub-pixel unit 1 are divided into the plurality of peripheral sub-pixels 3 which can be separately controlled according to the display requirements. Compared with the diagonal display of the contour boundary of the sub-pixel unit 1 in the pixel arrangement, the boundary of the desired display region shown by the dotted line in FIG. 1 is the smooth display boundary, thus reducing the serrated phenomenon. When the plurality of peripheral sub-pixel 3 located outside the desired display region are turned off, and the sub-pixel unit 1 is displayed as a whole, positions of the vertex angles 4 of the sub-pixel unit 1 are not displayed, thus achieving the compensation adjustment of the plurality of peripheral sub-pixels 3 to the central sub-pixel 2, reducing the problem of serrated display and improving the display effect of the display panel. The vertex angles 4 of the sub-pixel unit 1 may be made as rounded angles as requirements.

The pixel arrangement structure provided in the embodiment of the present disclosure includes the plurality of sub-pixel units, and each sub-pixel unit includes the central sub-pixel and the plurality of peripheral sub-pixels surrounding the central sub-pixel. A light emitting color of the central sub-pixel is the same as a light emitting color of the plurality of peripheral sub-pixels. Each of the plurality of sub-pixels includes a plurality of vertex angles, and each of the plurality of vertex angles is provided corresponding to a respective one of the plurality of peripheral sub-pixels. The each of the plurality of vertex angles is provided corresponding to the respective one of the plurality of peripheral sub-pixels, and when a line is displayed in a direction, the respective one peripheral sub-pixel arranged corresponding to each vertex angle in the each the sub-pixel unit and the central sub-pixel are separately controlled, so as to mitigate the problem of the serrated display of the display panel.

Figure 2:
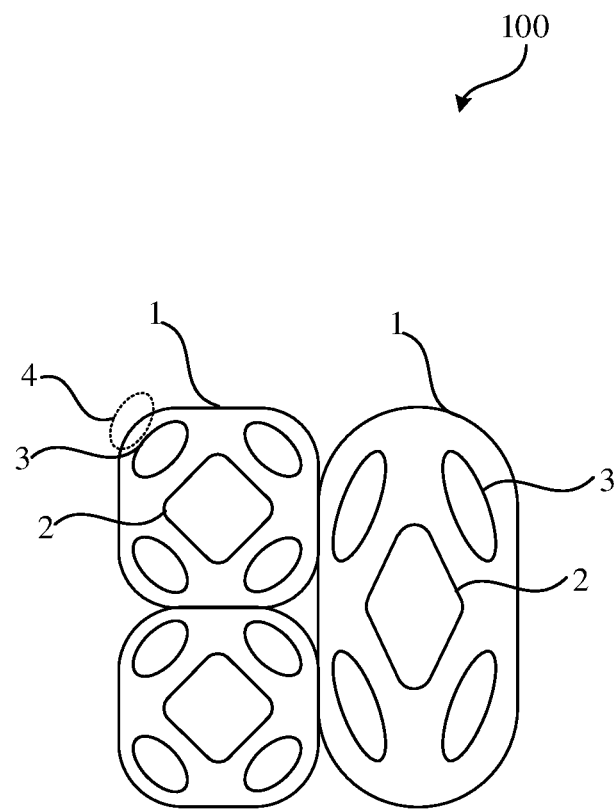
FIG. 2 is a schematic diagram of another pixel arrangement structure according to an embodiment of the present application.

In an embodiment, FIG. 2 is a schematic diagram of another pixel arrangement structure according to an embodiment of the present application. Referring to FIG. 2, a shape of each peripheral sub-pixel 3 of the plurality of peripheral sub-pixels 3 may be a polygon, a circle or an ellipse, and a shape of the central sub-pixel 2 may be a polygon, a circle or an ellipse.

The shape of each of the plurality of peripheral sub-pixels 3 may be the same as or different from the shape of the central sub-pixel 2. According to the display accuracy requirements of the actual display panel, in combination with the arrangement of the sub-pixel units 1, the shape of each of the plurality of peripheral sub-pixels 3 may be the polygon, the circle or the ellipse, the shape of the central sub-pixel 2 may be the polygon, the circle or the ellipse, and peripheral contours of the plurality of sub-pixel units 1 formed by the plurality of peripheral sub-pixels 3 and the central sub-pixel 2 may be the same in shape. When the shape of each of the plurality of peripheral sub-pixels 3 and the shape of the central sub-pixel 2 are the circle or the ellipse, the contour of each of the plurality of peripheral sub-pixels 3 and the contour of the central sub-pixel 2 are the circle or the ellipse when each of the plurality of peripheral sub-pixels 3 and the central sub-pixel 2 are turned on, which are closer to a boundary shape of a desired circular arc pattern, and the displayed circular arc pattern is closer to the real curved arc of the displayed circular arc pattern, which is beneficial to reducing the serrated phenomenon in a case of displaying the circular arc pattern. FIG. 2 exemplarily illustrates a situation in that the shape of each of the plurality of peripheral sub-pixels 3 is the ellipse and the shape of the central sub-pixel 2 is a diamond.

Figure 3:
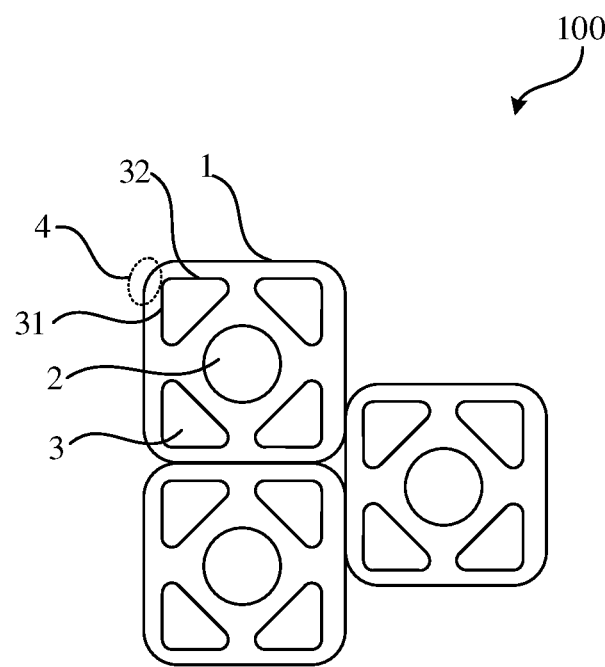
FIG. 3 is a schematic diagram of another pixel arrangement structure according to an embodiment of the present application.

In an embodiment, FIG. 3 is a schematic diagram of another pixel arrangement structure according to an embodiment of the present application. Referring to FIG. 3, the shape of each of the plurality of peripheral sub-pixels 3 is the polygon, each of the plurality of peripheral sub-pixels 3 includes a first side 31 and a second side 32 corresponding to two sides of a respective one of the plurality of vertex angles 4, and the first side 31 and the second side 32 are parallel to the two sides of the respective one of the plurality of vertex angles 4, respectively.

When the shape of each peripheral sub-pixel 3 disposed corresponding to the respective one of the plurality of vertex angles 4 of each sub-pixel unit 1 is the polygon, each of the plurality of peripheral sub-pixels 3 includes the first side 31 and the second side 32 corresponding to the two sides of the respective one of the plurality of vertex angles 4 of each of the plurality of sub-pixels 1, and the first side 31 and the second side 32 are parallel to the two sides of the respective one of the plurality of vertex angles 4 of each of the plurality of sub-pixels 1, respectively. When the central sub-pixel 2 and the plurality of peripheral sub-pixels 3 surrounding the central sub-pixel 2 can share the mask plate opening, the utilization efficiency of the opening can be improved; and it is ensured that the first side 31 and the second side 32 of each of the plurality of peripheral sub-pixels 3 is parallel to the two sides corresponding to the respective one of vertex angles 4 of the peripheral contour of the sub-pixel unit 1 in a case of displaying, so that an overall pattern of the peripheral contour formed by the plurality of peripheral sub-pixels 3 surrounding the central sub-pixel 2 approximates the peripheral contour of the sub-pixel unit 1, thereby reducing the problem that the peripheral sub-pixels 3 generates a new serrated display in the directions of the two sides corresponding to the respective one of the vertex angles 4 of the peripheral contour of the sub-pixel unit 1.

Figure 4:
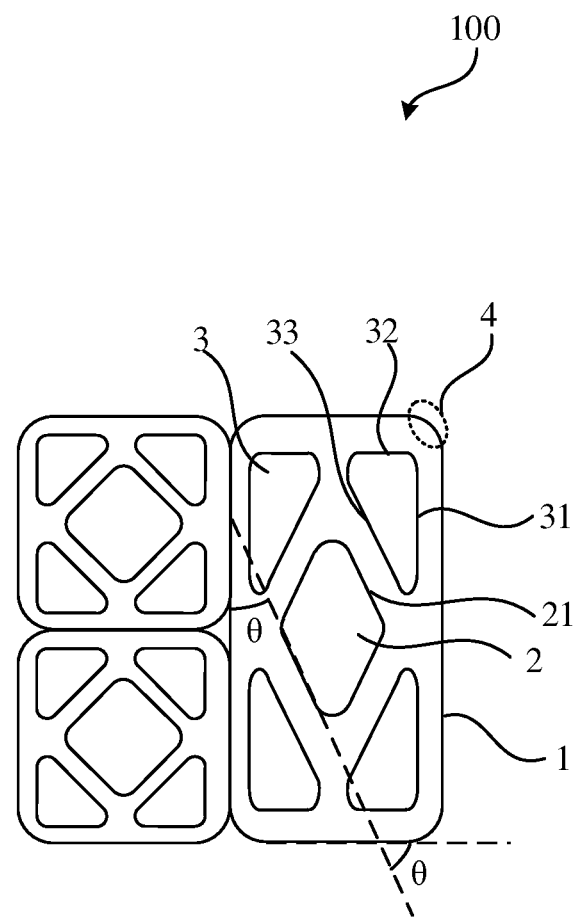
FIG. 4 is a schematic diagram of another pixel arrangement structure according to an embodiment of the present application.

In an embodiment, referring to FIG. 3, the first side 31 and the second side 32 each is parallel to a respective one of two sides of the respective one of the plurality of vertex angles 4 of each of the plurality of sub-pixels 1. When the peripheral sub-pixels 3 constituting the sub-pixel unit 1 are turned on during vertical line display, the contour displayed in a vertical direction is approximately a smooth straight line, and the serrated phenomenon in the vertical display is reduced. In an embodiment, FIG. 4 is a schematic diagram of another pixel arrangement structure according to an embodiment of the present application. Referring to FIG. 4, each of the plurality of peripheral sub-pixels 3 further includes a third side 22, and the third side is parallel to a side 21 in the central sub-pixel 2 corresponding to the third side 33.

The contour of the each sub-pixel 3 and the contour of the central sub-pixel 2 constitute an opening of a pixel define layer, and the third side 33 of each of the plurality of peripheral sub-pixels 3 is parallel to the side 21 in the central sub-pixel 2 corresponding to the third side 33, so that under the mask opening having the same area, an area of each of the plurality of peripheral sub-pixels 3 and an area of the central sub-pixel 2 are as large as possible. A distance between the central sub-pixel 2 and each of the plurality of peripheral sub-pixels 3 surrounding the central sub-pixel 2 can be made smaller and the opening ratio of the pixel boundary layer of the sub-pixel unit 1 can be improved on the premise that the pixel boundary layer formed by the contour of each of the plurality of peripheral sub-pixels 3 and the contour of the central sub-pixel 2 have independent openings.

In an embodiment, referring to FIG. 4, both the shape of the central sub-pixel 2 and the shape of each of the plurality of sub-pixels 1 are polygons, which have a same number of sides; and a side of the central sub-pixel 2 and a side of each of the plurality of sub-pixels 1 corresponding to the side of the central sub-pixel 2 form a setting included angle θ, and the setting included angle θ is greater than zero degree.

Both the central sub-pixel 2 and each of the plurality of sub-pixels 1 are polygons having the same number of sides, so that the central sub-pixel 2 has the largest opening in each of the plurality of sub-pixels 1. The side of the central sub-pixel 2 and the side of each of the plurality of sub-pixels 1 corresponding to the side of the central sub-pixel 1 form the setting included angle θ, so that each vertex angle of the central sub-pixel 2 corresponds to a respective one side of the sub-pixel unit 1. Thereby, each vertex angle 4 of the sub-pixel unit 1 corresponds to a respective one side of the central sub-pixel 2, a region between each vertex angle 4 of the sub-pixel unit 1 and the respective one side of the central sub-pixel 2 is sufficient to accommodate peripheral sub-pixels 3, and the opening ratio of each of the plurality of sub-pixels 1 is improved. At the same time, the side of the central sub-pixel 2 and the side of each of the plurality of sub-pixels 1 corresponding to the side of the central sub-pixel 2 form the setting included angle θ, so that the display along an extending direction of the side of the contour of each of the plurality of sub-pixels 1 does not have the serrated problem, while the display serrated problem along the extending direction of the side of the central sub-pixel 2 is reduced. The side of the central sub-pixel 2 and the side of each of the plurality of sub-pixels 1 corresponding to the side of the central sub-pixel 2 may be any one of two sides of a vertex angle of the sub-pixel unit 1 corresponding to the side of the central sub-pixel 2.

Figure 5:
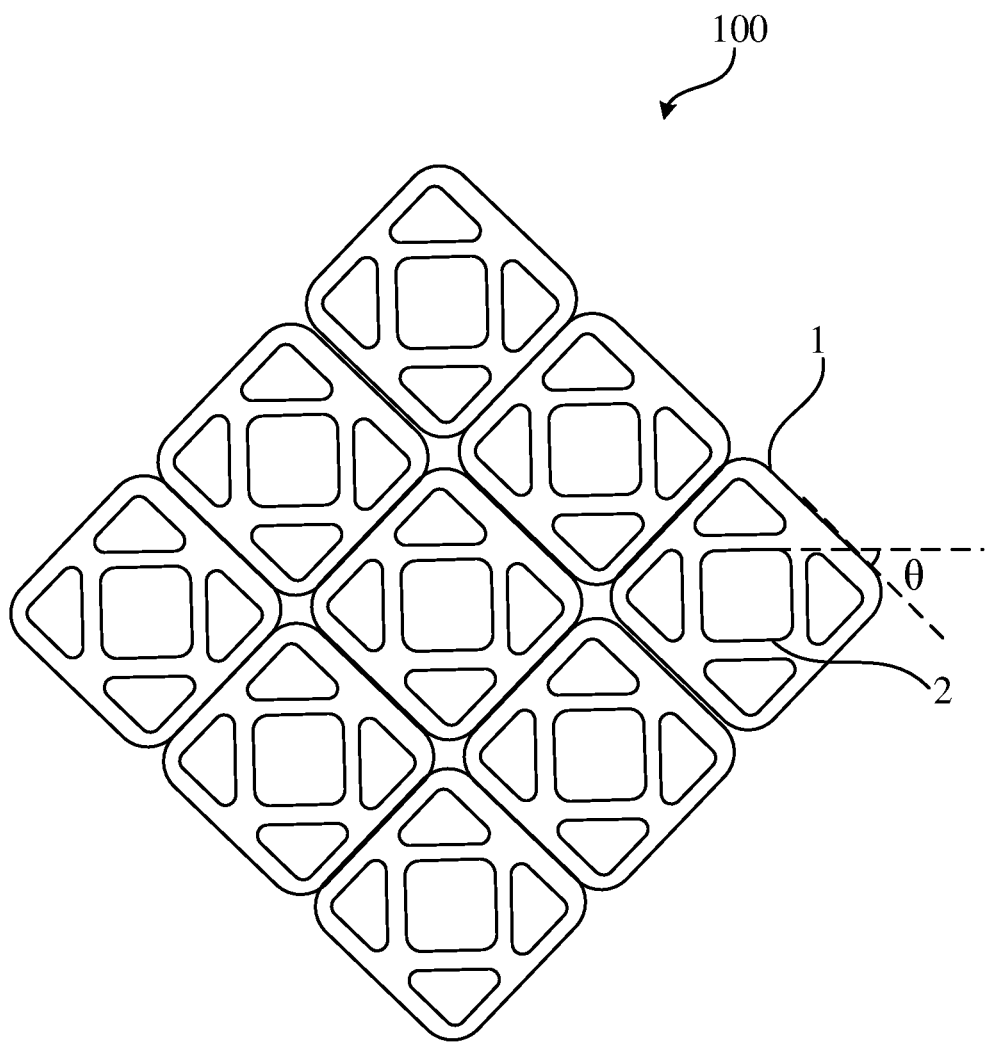
FIG. 5 is a schematic diagram of another pixel arrangement structure according to an embodiment of the present application.

FIG. 5 is a schematic diagram of another pixel arrangement structure according to an embodiment of the present application. Referring to FIG. 5, a magnitude of the setting included angle θ may be 45°±5°.

When the magnitude of the setting included angle θ between the side of the central sub-pixel 2 and the side of each of the plurality of sub-pixels 1 corresponding to the side of the central sub-pixel 2 is less than 40° or greater than 50°, the region between each vertex angle 4 of the sub-pixel unit 1 and the respective one side of the central sub-pixel 2 is relative small, the area of each of the plurality of peripheral sub-pixels 3 accommodated by the region is relative small, and each of the plurality of peripheral sub-pixels 3 balances the respective one vertex angle 4 of each of the plurality of sub-pixels 1 to a relative small extent resulting in the display serrated problem, thus reducing the opening ratio of each of the plurality of sub-pixels 1. When the magnitude of the setting included angle θ between the side of the central sub-pixel 2 and the side of each of the plurality of sub-pixels 1 corresponding to the side of the central sub-pixel 2 is greater than 40° and less than 50°, a region between the extending direction along the side of the contour of each of the plurality of sub-pixels 1 and the extending direction along the side of the central sub-pixel 2 is more evenly divided. It is possible to reduce the problem of the serrated display along the extending direction of the side of the central sub-pixel 2 or the extending direction of the side of each of the plurality of sub-pixels 1, and to reduce the problem of the serrated display when the region between the extending direction of the side of the contour of each of the plurality of sub-pixels 1 and the extending direction of the side of the central sub-pixel 2 is displayed obliquely. FIG. 5 illustrates a situation in that the magnitude of the setting included angle θ is 45°.

Figure 6:
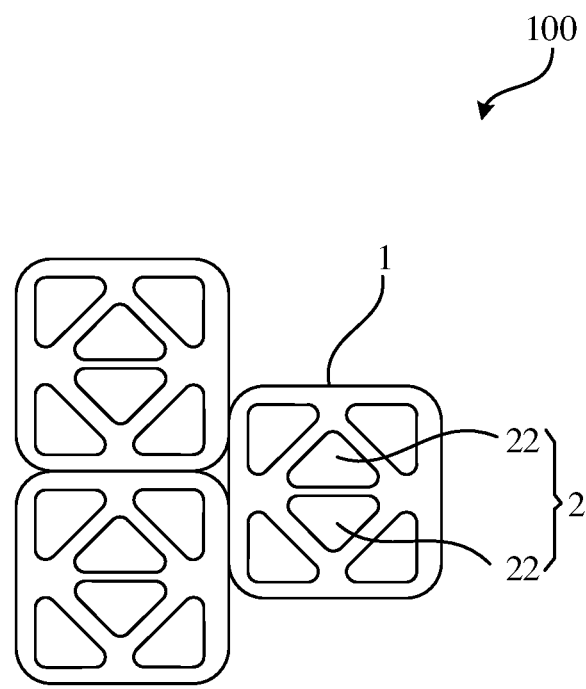
FIG. 6 is a schematic diagram of another pixel arrangement structure according to an embodiment of the present application.

In an embodiment, FIG. 6 is a schematic diagram of another pixel arrangement structure according to an embodiment of the present application. Referring to FIG. 6, the central sub-pixel 2 includes at least two central vice-pixels 22, and a side of one central vice-pixel 22 of two adjacent central vice-pixels 22 and a side of the other central vice-pixel 22 of the two adjacent central vice-pixels 22 facing to the side of the one central vice-pixel 22 of the two adjacent central vice-pixels 22 are parallel to each other.

Figure 7:
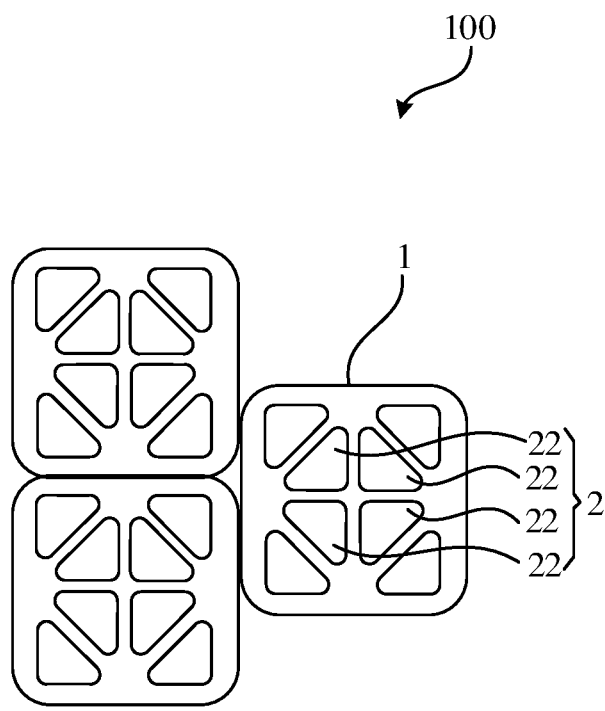
FIG. 7 is a schematic diagram of another pixel arrangement structure according to an embodiment of the present application.

The central sub-pixel 2 includes at least two central vice-pixels 22, that is, the central sub-pixel 2 can be divided into smaller pixel units. A plurality of central vice-pixels 22 are separately controlled, and compared with the integral control of the central sub-pixel 2 for displaying, the area of the central sub-pixel 2 is reduced. When the central sub-pixel 2 is located at a boundary of the desired display region, the plurality of central vice-pixels 22 located in the desired display region are separately controlled, so that a display boundary is smoother, the serrated phenomenon formed by the central sub-pixel 2 on the display boundary is reduced, and the serrated problem when the central sub-pixel 2 is displayed is better solved. The side of the one central vice-pixel 22 of the two adjacent central vice-pixels 22 and the side of the other central vice-pixel 22 of the two adjacent central vice-pixels 22 facing to the side of the one central vice-pixel 22 of the two adjacent central vice-pixels 22 are parallel to each other, so that the adjacent central vice-pixels 22 are reduced to generate a new serrated boundary, so that an opening of the central vice-pixels 22 is as large as possible, and the opening ratio of the central vice-pixels 22 is improved. FIG. 6 illustrates a situation in that the central sub-pixel 2 includes two central vice-pixels 22. FIG. 7 is a schematic diagram of another pixel arrangement structure according to an embodiment of the present application. Referring to FIG. 7, FIG. 7 illustrates a situation in that the central sub-pixel 2 includes four central vice-pixels 22. The four central vice-pixels 22 are separately controlled, thus reducing the serrated problem when a boundary of the display region is located in the central sub-pixel 2.

In an embodiment, referring to FIGS. 1 and 5, the pixel arrangement structure 100 includes a plurality of sub-pixel units 1 arranged in an array, each sub-pixel unit 1 includes at least one side disposed along a predetermined direction or the central sub-pixel 2 of each of the plurality of sub-pixels 1 includes at least one side disposed along a predetermined direction, and the predetermined direction is a row direction of the array or a column direction of the array.

Each of the plurality of sub-pixels 1 includes at least one side disposed along the predetermined direction, so that when each of the plurality of sub-pixels 1 is displayed along the predetermined direction, the serrated problem when the boundary of the display region is located at one side of the sub-pixel unit 1 which is provided along the predetermined direction is reduced. The central sub-pixel 2 of each of the plurality of sub-pixels 1 includes at least one side arranged along the predetermined direction, so that the serrated problem when the boundary of the display region is located at one side of the central sub-pixel 2 arranged along the predetermined direction is reduced, for example, the serrated problem in a horizontal direction, a vertical direction and an oblique direction is reduced, and the problem of the serrated display weakened in multi-angle and multi-direction can be achieved.

In an embodiment, referring to FIG. 1, the pixel arrangement structure 100 includes the plurality of sub-pixel units 1 arranged in an array, and the plurality of sub-pixel units 1 include a first sub-pixel unit 101, a second sub-pixel unit 102 and a third sub-pixel unit 103, which have different light emitting colors. In the array, along the predetermined direction, first sub-pixel units 101, second sub-pixel units 102 and third sub-pixel units 103 located in a same row are arranged in sequence; and in two adjacent rows, a geometrical center of each of third sub-pixel units 103 located in one row of the two adjacent rows is located between a geometrical center of a respective one of first sub-pixel units 101 located in the other one row of the two adjacent rows adjacent to the each of the third sub-pixel units 103 and a geometrical center of a respective one of second sub-pixel units 102 located in the other one row of the two adjacent rows adjacent to the each of the third sub-pixel units 103. The predetermined direction is a row direction or a column direction of a sub-pixel unit array. FIG. 1 illustrates a situation in that the first sub-pixel unit 101 is a red sub-pixel, the second sub-pixel unit 102 is a green sub-pixel and the third sub-pixel unit 103 is a blue sub-pixel, and which is not limited to the first sub-pixel unit 101, the second sub-pixel unit 102, and the third sub-pixel unit 103.

This arrangement enables the first sub-pixel unit 101, the second sub-pixel unit 102 and the third sub-pixel unit 103 to achieve pixel sharing and together constitute a light emitting unit, thereby improving the pixel utilization efficiency of the first sub-pixel unit 101, the second sub-pixel unit 102, and the third sub-pixel unit 103. Referring to FIG. 1, the first sub-pixel unit 101, the second sub-pixel unit 102 and the third sub-pixel unit 103 each includes a central sub-pixel 2 and a plurality of peripheral sub-pixels 3 surrounding the central sub-pixel 2. In the case of displaying in the vertical direction or the oblique direction, the central sub-pixel 2 and the plurality of peripheral sub-pixels 3 located in the display region are illuminated, the central sub-pixels 2 of the sub-pixel units having different light emitting colors and the peripheral sub-pixels 3 of the sub-pixel units having different light emitting colors are shared, white light is emitted for displaying, and the central sub-pixel 2 and the plurality of peripheral sub-pixels 3 located outside the display region are turned off, thereby reducing the serrated problem of the display picture. FIG. 1 illustrates a situation in that in a case of displaying in the oblique direction, a region located between dotted lines is the display region, when the central sub-pixel 2 and the plurality of peripheral sub-pixels 3 are located at the boundary of the display region, the central sub-pixel 2 and the plurality of peripheral sub-pixels 3 having an area located in the display region larger than or equal to an area located outside the display region can be illuminated, and the central sub-pixel 2 and the plurality of peripheral sub-pixels 3 having the area located in the display region smaller than the area located outside the display region can be turned off, thus reducing the serrated problem of the display picture. Referring to FIG. 1, FIG. 1 illustrates a situation in that in a case of displaying in the vertical direction, a region located between solid lines is the display region, the serrated problem of the display boundary in a case of displaying in the vertical direction is reduced.

In an embodiment, the plurality of sub-pixel units 1 include a first sub-pixel unit, a second sub-pixel unit and a third sub-pixel unit, which have different light emitting colors. In the pixel arrangement structure provided in the embodiment of the present application, the plurality of sub-pixel units are arranged in an array. In the array, along the predetermined direction, first sub-pixel units 101 and second sub-pixel units 102 in an n-th row are arranged in sequence, and third sub-pixel units 103 in an (n+1)-th row are arranged in sequence. An arrangement order of the first sub-pixel units 101 and the second sub-pixel units 102 in the n-th row is the same as or different from an arrangement order of first sub-pixel units 101 and second sub-pixel units 102 in an (n+2)-th row. n is an odd number greater than or equal to 1 or an even number greater than or equal to 0, and the predetermined direction is the row direction or the column direction of the sub-pixel unit array.

Figure 8:
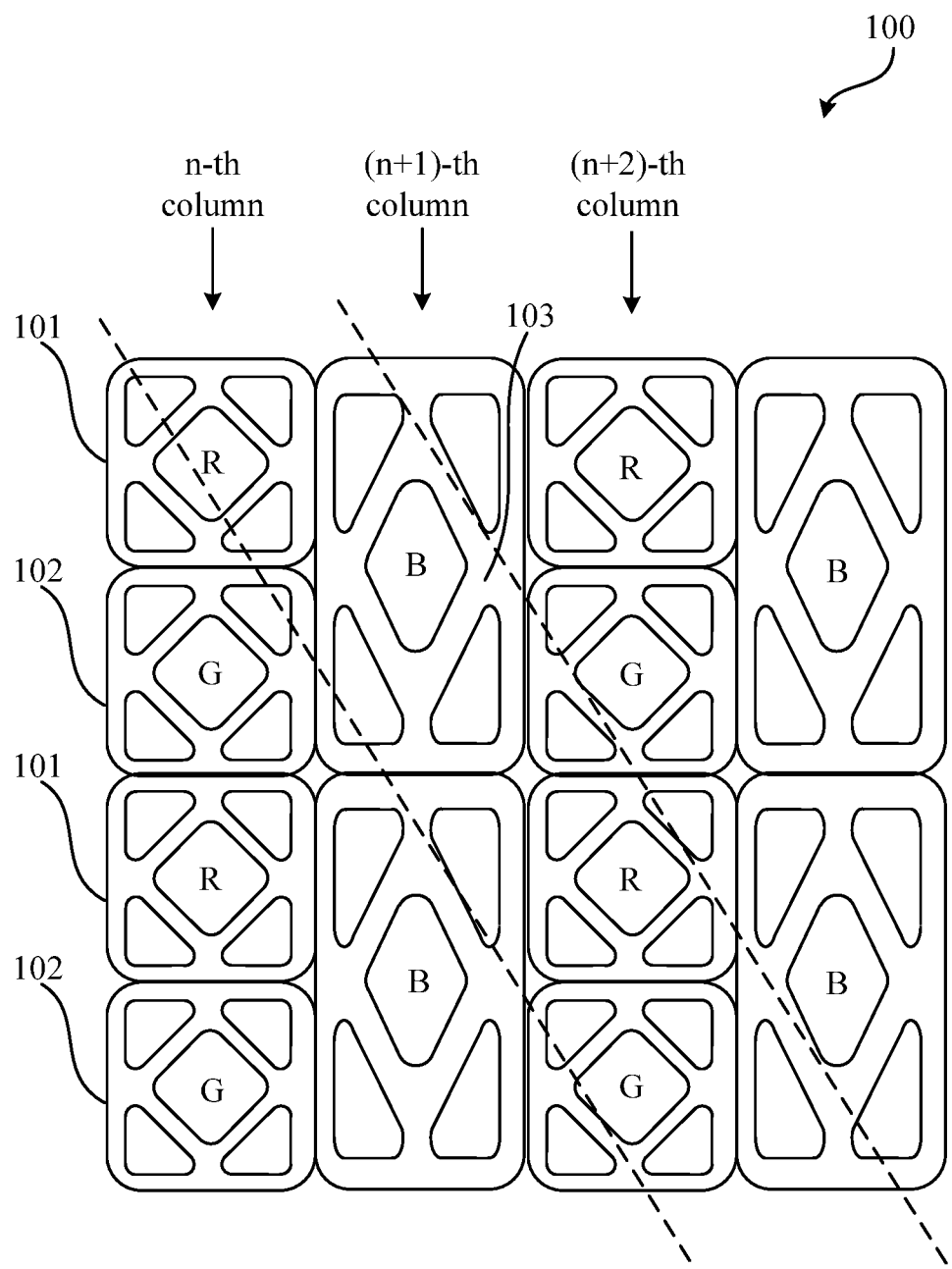
FIG. 8 is a schematic diagram of another pixel arrangement structure according to an embodiment of the present application.

FIG. 8 is a schematic diagram of another pixel arrangement structure according to an embodiment of the present application. Referring to FIG. 8, in an embodiment, along the column direction, first sub-pixel units 101 and second sub-pixel units 102 in an n-th column are arranged in sequence, and third sub-pixel units 103 in an (n+1)-th column are arranged in sequence; and along the column direction, a geometrical center of each of the third sub-pixel units 103 located in one column of the two adjacent columns is located between a geometrical center of a respective one of the first sub-pixel units 101 located in the other one column of the two adjacent rows adjacent to the each of the third sub-pixel units 103 and a geometrical center of a respective one of second sub-pixel units 102 located in the other one column of the two adjacent rows adjacent to the each of the third sub-pixel units 103. An arrangement order of the first sub-pixel units 101 and the second sub-pixel units 102 in the n-th column is the same as an arrangement order of first sub-pixel units 101 and second sub-pixel units 102 in an (n+2)-th column, that is, in the (n+2)-th column, the first sub-pixel units 101 and the second sub-pixel units 102 are arranged in sequence. This arrangement achieves pixel sharing of the first sub-pixel units 101, the second sub-pixel units 102, and the third sub-pixel units 103, and the light emitting efficiency is improved; at the same time, the serrated problem of the display picture is reduced in a case of displaying in the vertical direction, the horizontal direction and the oblique direction, and the display effect of the display panel is improved. FIG. 8 illustrates a situation in that along the column direction, the first sub-pixel unit 101, the second sub-pixel unit 102 and the third sub-pixel unit 103 are arranged in a triangle shape, an arrangement order of the first sub-pixel units 101 and the second sub-pixel units 102 in the n-th column is the same as an arrangement order of first sub-pixel units 101 and second sub-pixel units 102 in an (n+2)-th column, a magnitude of the first sub-pixel unit 101 is equal to a magnitude of the second sub-pixel unit 102, and a magnitude of the third sub-pixel unit 103 is 2 times of the magnitude of the first sub-pixel unit 101.

Figure 9:
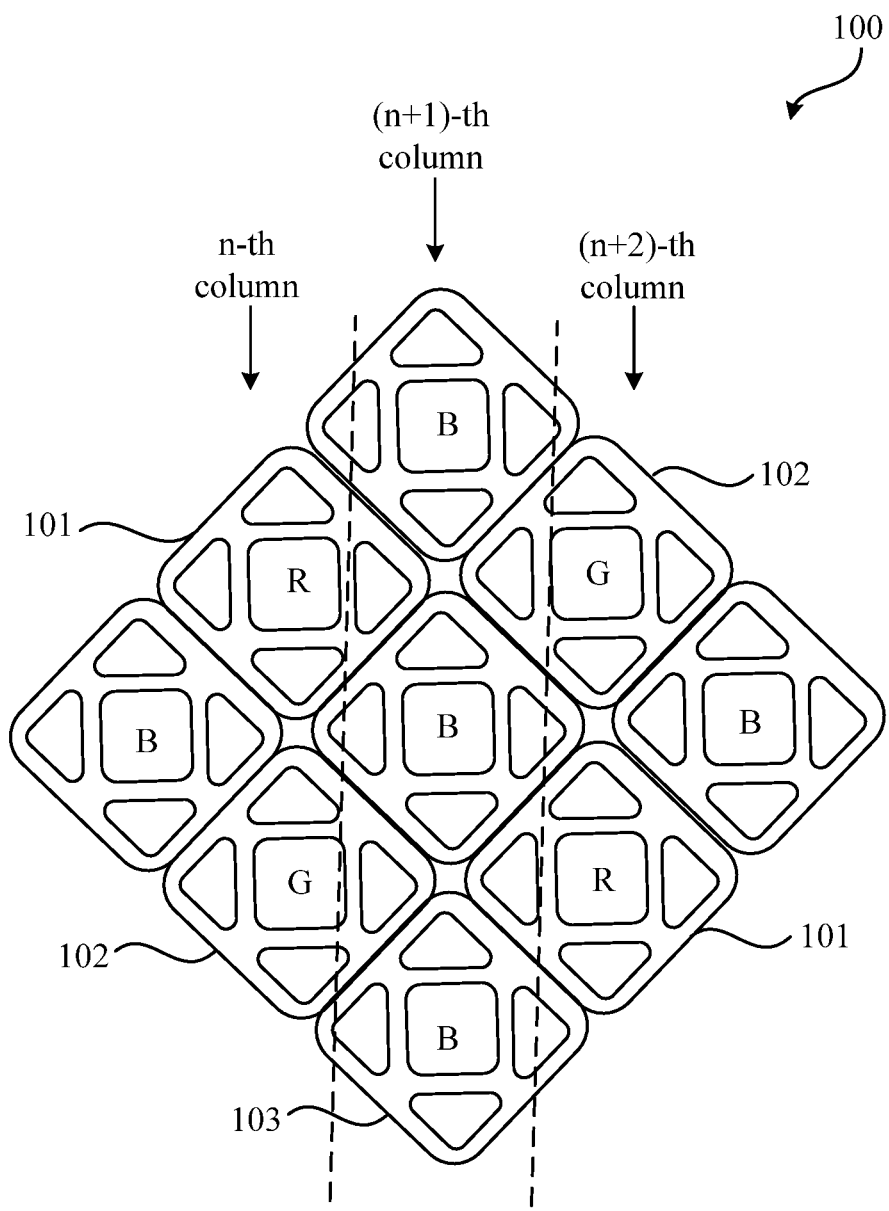
FIG. 9 is a schematic diagram of another pixel arrangement structure according to an embodiment of the present application.

FIG. 9 is a schematic diagram of another pixel arrangement structure according to an embodiment of the present application. Referring to FIG. 9, in an embodiment, along the column direction, the first sub-pixel units 101 and the second sub-pixel units 102 in the n-th column are arranged in sequence, and the third sub-pixel units 103 in the (n+1)-th column are arranged in sequence; and along the column direction, a geometrical center of each of the third sub-pixel units 103 located in one column of the two adjacent columns is located between a geometrical center of a respective one of the first sub-pixel units 101 located in the other one column of the two adjacent rows adjacent to the each of the third sub-pixel units 103 and a geometrical center of a respective one of second sub-pixel units 102 located in the other one column of the two adjacent rows adjacent to the each of the third sub-pixel units 103. An arrangement order of the first sub-pixel units 101 and the second sub-pixel units 102 in the n-th column is different from an arrangement order of first sub-pixel units 101 and second sub-pixel units 102 in an (n+2)-th column, that is, in the (n+2)-th column, the first sub-pixel units 101 and the second sub-pixel units 102 are arranged in sequence. This arrangement achieves pixel sharing of the first sub-pixel units 101, the second sub-pixel units 102, and the third sub-pixel units 103, and the light emitting efficiency is improved; at the same time, the serrated problem of the display picture is reduced in a case of displaying in the vertical direction, the horizontal direction and the oblique direction, and the display effect of the display panel is improved. FIG. 9 illustrates a situation in that along the column direction, first sub-pixel units 101 and second sub-pixel units 102 in an n-th row are alternately arranged in sequence, and third sub-pixel units 103 in an (n+1)-th column are arranged in sequence; and along the column direction, a geometrical center of each of the third sub-pixel units 103 located in one column of the two adjacent columns is located between a geometrical center of a respective one of the first sub-pixel units 101 located in the other one column of the two adjacent rows adjacent to the each of the third sub-pixel units 103 and a geometrical center of a respective one of second sub-pixel units 102 located in the other one column of the two adjacent rows adjacent to the each of the third sub-pixel units 103. An arrangement order of the first sub-pixel units 101 and the second sub-pixel units 102 in the n-th column is different from an arrangement order of first sub-pixel units 102 and second sub-pixel units 102 in an (n+2)-th column, and a magnitude of the first sub-pixel unit 101, a magnitude of the second sub-pixel unit 102 and a magnitude of the third sub-pixel unit 103 are the same.

Figure 10:
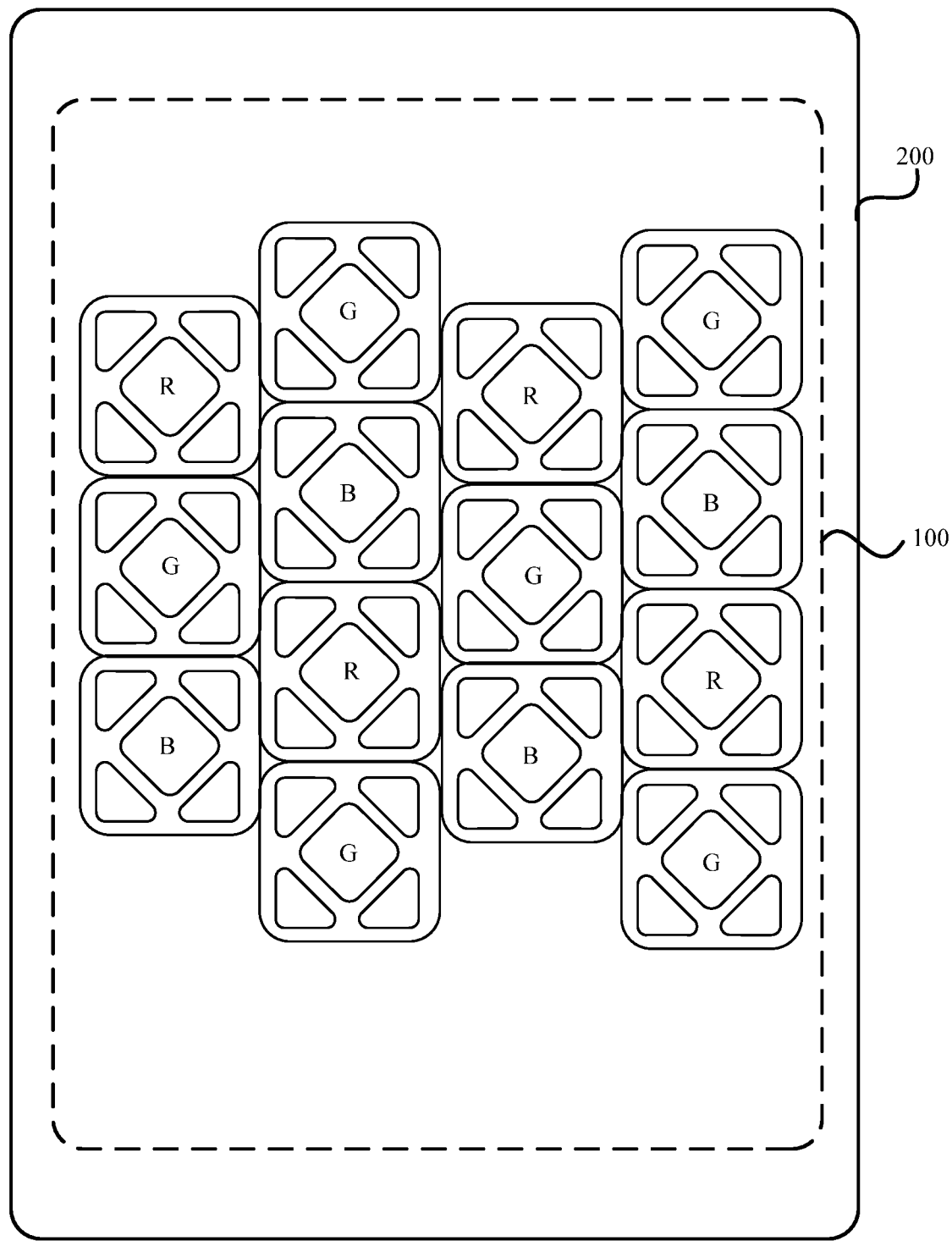
FIG. 10 is a structure diagram of a display panel according to an embodiment of the present application.

FIG. 10 is a structure diagram of a display panel according to an embodiment of the present application. Referring to FIG. 10, an embodiment of the present application provides a display panel 200, including the pixel arrangement structure 100 in any embodiments described above.

As shown in FIG. 10, the embodiment of the present application provides the display panel 200, including the pixel arrangement structure 100 in any embodiments described above, which has the effect of the pixel arrangement structure 100 in the above embodiments and will not be described here. In an embodiment, the display panel 200 may be a display panel of a display device such as a mobile phone, a wearable device having a display function, a computer, etc., and may be an organic light emitting display panel or a liquid crystal display panel.

What is claimed is:

1. A pixel arrangement structure, comprising:
   a plurality of sub-pixel units;
   wherein each of the plurality of sub-pixel units comprises a central sub-pixel and four peripheral sub-pixels surrounding the central sub-pixel, and a light emitting color of the central sub-pixel is same as a light emitting color of the four peripheral sub-pixels; and
   each of the plurality of sub-pixel units comprises a plurality of vertex angles, and each vertex angle of the plurality of vertex angles is provided with one of the four peripheral sub-pixels, wherein in each of the plurality of sub-pixel units, the central sub-pixel has a pair of first edges extending along a first direction and a pair of second edges extending along a second direction perpendicular to the first direction, the peripheral sub-pixels being respectively disposed beside the pair of first edges and the pair of second edges of the central sub-pixel;
   wherein the vertex angles are rounded, a shape of each of the four peripheral sub-pixels is a triangle, a shape of the central sub-pixel is a rectangle, each of the four peripheral sub-pixels comprises a first side, a second side, and a third side, wherein the first side and the second side correspond to two sides of a respective vertex angle of the plurality of vertex angles, the first side and the second side are parallel to the two sides of the respective vertex angle, respectively, and the third side is parallel to a side of the central sub-pixel corresponding to the third side.

2. The pixel arrangement structure of claim 1, wherein the plurality of sub-pixel units are arranged in an array, each of the plurality of sub-pixel units comprises at least one side disposed along a predetermined direction or the central sub-pixel of each of the plurality of sub-pixel units comprises at least one side disposed along a predetermined direction, wherein the predetermined direction is a row direction or a column direction of the array.

3. The pixel arrangement structure of claim 2, wherein the plurality of sub-pixel units comprises first sub-pixel units, second sub-pixel units and third sub-pixel units, wherein the first sub-pixel unit, the second sub-pixel unit and the third sub-pixel unit have different light emitting colors; and
   wherein in the array, along the predetermined direction, the first sub-pixel units, the second sub-pixel units and the third sub-pixel units located in a same row are arranged in sequence; and in two adjacent rows, a geometrical center of each third sub-pixel unit of the third sub-pixel units located in one row of the two adjacent rows is located between a geometrical center of a respective one first sub-pixel unit of the first sub-pixel units located in another row of the two adjacent rows adjacent to the each third sub-pixel unit of the third sub-pixel units and a geometrical center of a respective one second sub-pixel unit of the second sub-pixel units located in the other row of the two adjacent rows adjacent to the each third sub-pixel unit of the third sub- pixel units.

4. The pixel arrangement structure of claim 2, wherein the plurality of sub-pixel units comprises first sub-pixel units, second sub-pixel units and third sub-pixel units, wherein the first sub-pixel unit, the second sub-pixel unit and the third sub-pixel unit have different light emitting colors; and wherein in the array, along the predetermined direction, the first sub-pixel units and the second sub-pixel units in an n-th row are alternately arranged in sequence, and the third sub-pixel units in an (n+1)-th row are arranged in sequence;

wherein an arrangement order of the first sub-pixel units and the second sub-pixel units in the n-th row is same as or different from an arrangement order of the first sub-pixel units and the second sub-pixel units in an (n+2)-th row; and wherein n is an odd number greater than or equal to 1 or an even number greater than or equal to 0.

5. The pixel arrangement structure of claim 4, wherein along the column direction, in two adjacent columns, a geometrical center of each third sub-pixel unit of the third sub-pixel units located in one column of the two adjacent columns is located between a geometrical center of a respective one first sub-pixel unit of the first sub-pixel units located in another column of the two adjacent columns adjacent to the each third sub-pixel unit of the third sub-pixel units and a geometrical center of a respective one second sub-pixel unit of the second sub-pixel units located in the another column of the two adjacent columns adjacent to the each third sub-pixel unit of the third sub-pixel units.

6. The pixel arrangement structure of claim 4, wherein along the column direction, the first sub-pixel unit, the second sub-pixel unit and the third sub-pixel unit are arranged in a triangle shape, an arrangement order of the first sub-pixel units and the second sub-pixel units in an n-th column is same as an arrangement order of the first sub-pixel units and the second sub-pixel units in an (n+2)-th column, a magnitude of the first sub-pixel unit is equal to a magnitude of the second sub-pixel unit, and a magnitude of the third sub-pixel unit is 2 times of the magnitude of the first sub-pixel unit.

7. The pixel arrangement structure of claim 4, wherein along the column direction, an arrangement order of the first sub-pixel units and the second sub-pixel units in an n-th column is different from an arrangement order of the first sub-pixel units and the second sub-pixel units in an (n+2)-th column, and a magnitude of the first sub-pixel unit, a magnitude of the second sub-pixel unit and a magnitude of the third sub-pixel unit are same.

8. The pixel arrangement structure of claim 1, wherein the central sub-pixel and the four peripheral sub-pixels surrounding the central sub-pixel are separately controlled.

9. A display panel, comprising the pixel arrangement structure of claim 1.

* * * * *